(12) United States Patent
Ning

(10) Patent No.: US 6,713,395 B2
(45) Date of Patent: Mar. 30, 2004

(54) SINGLE RIE PROCESS FOR MIMCAP TOP AND BOTTOM PLATES

(75) Inventor: Xian J. Ning, Mohegan Lake, NY (US)

(73) Assignee: Infineon Technologies AG, Munich (DE)

(*) Notice: Subject to any disclaimer, the term of this patent is extended or adjusted under 35 U.S.C. 154(b) by 151 days.

(21) Appl. No.: 09/855,894

(22) Filed: May 15, 2001

(65) Prior Publication Data

US 2002/0173159 A1 Nov. 21, 2002

(51) Int. Cl.[7] .................. H01L 21/302; H01L 21/3065; H01L 21/311
(52) U.S. Cl. ............... 438/694; 438/706; 438/712; 438/725
(58) Field of Search ................. 438/694, 706, 438/712, 725

(56) References Cited

U.S. PATENT DOCUMENTS

| | | | | | |
|---|---|---|---|---|---|
| 4,592,132 A | * | 6/1986 | Lee et al. | ................. | 438/637 |
| 4,657,629 A | * | 4/1987 | Bigelow | ................. | 156/643 |
| 5,492,607 A | * | 2/1996 | Yap | ................. | 204/192.34 |
| 6,284,551 B1 | * | 9/2001 | Cho et al. | ................. | 438/3 |
| 6,319,767 B1 | * | 11/2001 | Cha et al. | ................. | 438/250 |
| 6,420,261 B2 | * | 7/2002 | Kudo | ................. | 438/633 |

* cited by examiner

*Primary Examiner*—Nadine Norton
*Assistant Examiner*—Lynette T. Umez-Eronini
(74) *Attorney, Agent, or Firm*—Slater & Matsil, L.L.P.

(57) ABSTRACT

A method of forming MIM capacitor top (16) and bottom (12) plates, using a first and second resist (18/20) and a single RIE process. A first conductive layer (12) is deposited over a substrate (10). An insulating layer (14) is deposited over the first conductive layer (12). A second conductive layer (16) is deposited over the insulating layer (14). A first resist (18) is deposited over the second conductive layer (16), and the first resist (18) is patterned. A second resist (20) is deposited over the first resist (18) and patterned. The first and second resist (18/20) patterns are simultaneously transferred to the first and second conductive layers (12) and (16), respectively, by exposure to a single reactive ion etch (RIE) process.

19 Claims, 2 Drawing Sheets

SINGLE RIE PROCESS FOR MIMCAP TOP AND BOTTOM PLATES

TECHNICAL FIELD

The present invention relates generally to the fabrication of semiconductor devices, and more particularly to metal-insulator-metal (MIM) capacitors.

BACKGROUND OF THE INVENTION

Semiconductors are widely used for integrated circuits for electronic applications, including radios, televisions and personal computing devices, as examples. Such integrated circuits typically use multiple transistors fabricated in single crystal silicon. It is common for there to be millions of semiconductor devices on a single semiconductor product. Many integrated circuits now include multiple levels of metallization for interconnections.

One type of semiconductor device is a MIM capacitor, which comprises a bottom capacitive plate formed in a metallization layer, a top capacitive plate in an overlying layer, the top and bottom plates being separated by a capacitor dielectric layer. MIM capacitors are used frequently in mixed signal devices and logic devices, for example.

A problem with manufacturing MIM capacitors is that the capacitor dielectric separating the two capacitive plates is very thin, e.g., 500 to 700 Angstroms thick. This can result in very high leakage currents due to conductive particles, e.g. from etching the plates, that may be present at the site of the capacitor dielectric. As a result, MIM capacitor designs typically comprise a top metal plate that is smaller in area than the bottom metal plate to prevent high leakage currents and shorts.

Because most MIM capacitors have this step-like construction from the bottom to top plates, a separate lithography and etch step is required to form each of the top and bottom capacitor plates. This requires the use of two masks, two lithography steps, and two etch steps, one each for the bottom plate and the top plate.

What is needed in the art is a method of manufacturing MIM capacitors that has fewer etch steps, reduced complexity and a cost reduction compared to prior art MIM capacitor manufacturing methods.

SUMMARY OF THE INVENTION

These problems are generally solved or circumvented by the present invention, which achieves technical advantages as a method of simultaneously forming top and bottom plates of a MIM capacitor. A first resist is used to provide the pattern for the bottom metal plate, and a second resist is used to provide the pattern for the top metal plate of a MIM capacitor. The combined patterns of the first and second resist are simultaneously transferred to the underlying metallization layers in a single reactive ion etch (RIE) process.

Disclosed is a method of patterning metal layers of a semiconductor wafer, the method comprising depositing a first conductive layer over a substrate, depositing an insulating layer over the first conductive layer, depositing a second conductive layer over the insulating layer, depositing a first resist over the second conductive layer, depositing a second resist over the first resist, patterning the first resist with a first pattern, patterning the second resist with a second pattern, and simultaneously transferring the first pattern to the first conductive layer and the second pattern to the second conductive layer.

Also disclosed is a method of patterning metal layers of a semiconductor wafer, the wafer comprising a first conductive layer, an insulating layer disposed over the first conductive layer and a second conductive layer disposed over the insulating layer. The method comprises depositing a first resist over the second conductive layer, patterning the first resist with a first pattern, depositing a second resist over the first resist, patterning the second resist with a second pattern, and simultaneously transferring the first pattern to the first conductive layer and transferring the second pattern to the second conductive layer.

Further disclosed is a method of forming capacitive plates of a MIM capacitor, comprising providing a wafer having a substrate, depositing a first conductive layer on the substrate, depositing a capacitor dielectric layer over the first conductive layer, depositing a second conductive layer over the capacitor dielectric layer, depositing a first resist over the second conductive layer, patterning the first resist with a first pattern, depositing a second resist over the first resist, patterning the second resist with a second pattern, simultaneously transferring the first pattern to the first conductive layer and transferring the second pattern to the second conductive layer.

Advantages of the invention include providing a method of transferring the pattern of top and bottom metal plates simultaneously, resulting in less manufacturing process complexity. The invention results in fewer defects, reduced throughput and lower manufacturing costs. With the use of the single RIE pattern transfer method in accordance with the present invention, one RIE step, one resist strip, and one cleaning step may be eliminated in the manufacturing process for a MIM capacitor. The invention also results in improved yields because there is less chance of misalignment of the top and bottom capacitive plates.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

A description of preferred embodiments of the present invention will be discussed, followed by some advantages thereof. Four MIM capacitors are shown in each figure, although many MIM capacitors and other conductive lines may be present within each layer.

Figure 1:
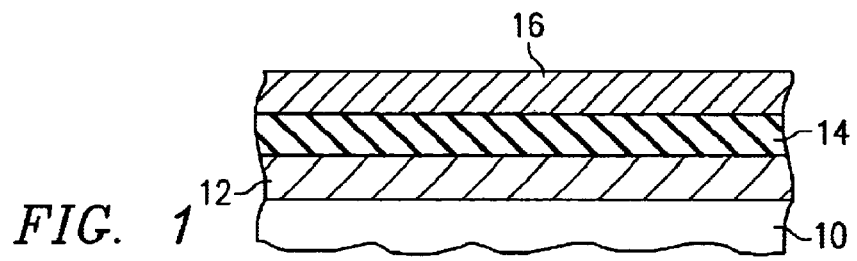
FIGS. 1 through 7 illustrate cross-sectional views of a MIM capacitor in various stages of manufacturing in accordance with an embodiment of the present invention.

Referring to FIG. 1, a workpiece 10 is provided, typically comprising silicon oxide over single-crystal silicon. The workpiece 10 may include other conductive layers or other semiconductor elements, e.g. transistors, diodes, etc. Compound semiconductors such as GaAs, InP, Si/Ge, SiC, as examples, may be used in place of silicon.

A first metallization layer 12 is deposited over the workpiece 10. First metallization layer 12 preferably comprises a conductive material such as Al, TiN, Ti, W, combinations thereof, or other conductive materials, as examples, deposited by physical vapor deposition (PVD) or chemical vapor deposition (CVD). Metallization layer 12 may comprise an M1 or M2 metallization layer, for example.

A dielectric layer 14 is deposited over the first metallization layer 12. Dielectric layer 14 preferably comprises an insulator such as a capacitor dielectric and may comprise saline oxide, tetraethoxysilane (TEOS), silicon dioxide, silicon nitride, silicon oxynitride, barium strontium titanate (BST) or other insulators, as examples.

A second metallization layer 16 is deposited over dielectric layer 14. Second metallization layer 16 preferably comprises Al, TiN, Ti, W, combinations thereof, or other conductive materials, as examples.

Figure 2:
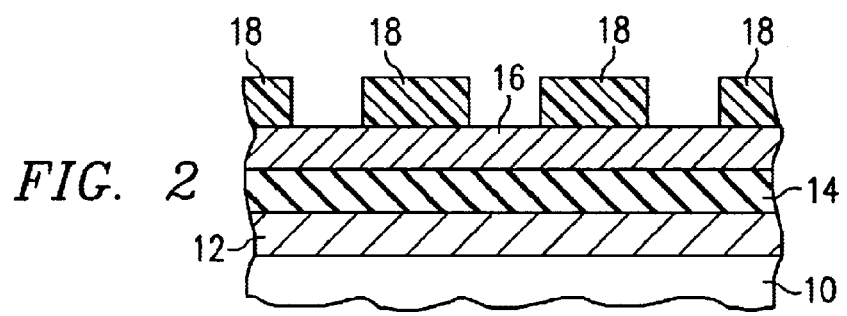

A first resist 18 is deposited over second metallization layer 16, as shown in FIG. 2. First resist 18 is patterned by lithography, for example, with a mask, not shown. Preferably, first resist 18 comprises a negative resist; for example, first resist 18 preferably comprises CGR or other negative resists. The first resist 18 is exposed and developed. The first resist 18 pattern preferably comprises the pattern for the bottom capacitor plate for a MIM capacitor, to be described further herein.

Figure 3A:
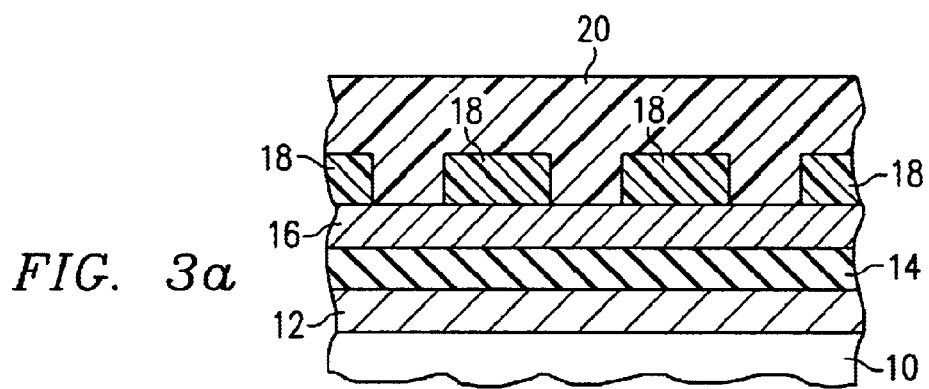
Figure 3B:
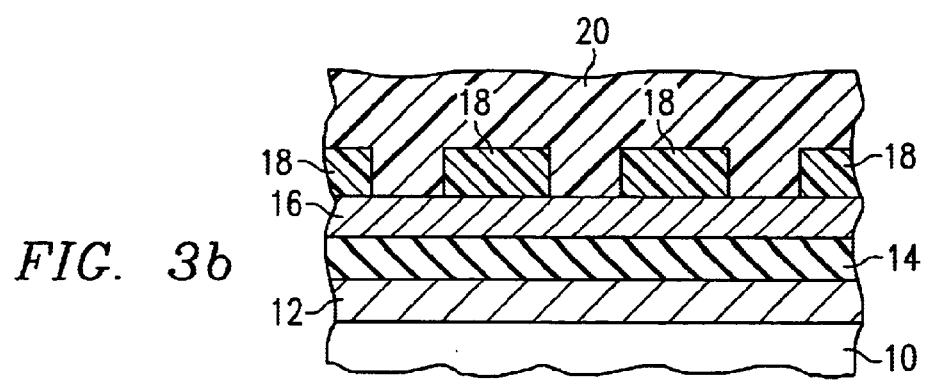

A second resist 20 is deposited over exposed portions of second metallization layer 16 and the first resist 18, as shown in FIGS. 3a and 3b. Second resist 20 may be conformal as shown in FIG. 3a, or alternatively, may conform to the pattern of the first resist 18, as shown in FIG. 3b. Preferably, second resist 20 comprises a positive resist such as UV82, for example.

Figure 4:
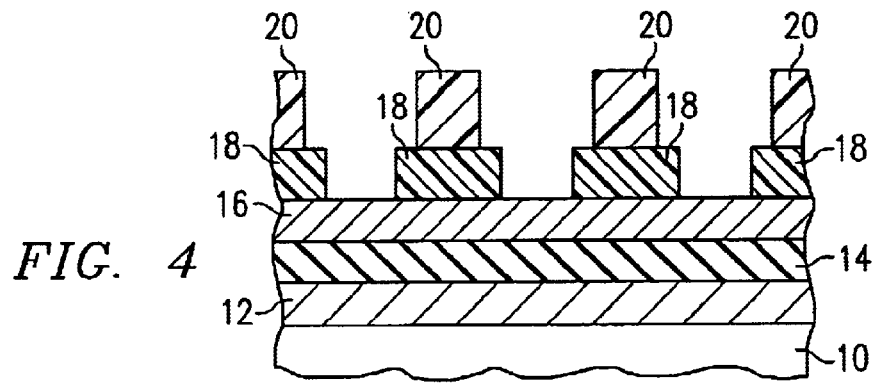

Second resist 20 is patterned by lithography with the pattern for the MIM capacitor top plates. Second resist 20 is patterned, for example, using a mask, not shown, and exposed portions of the second resist 20 are developed, stripped and cleaned, leaving the structure shown in FIG. 4. The resulting structure comprises a two-layer resist including first resist 18 and second resist 20. The second resist 20 is disposed over the first resist 18 and has a smaller pattern than the first resist 18.

Figure 5:
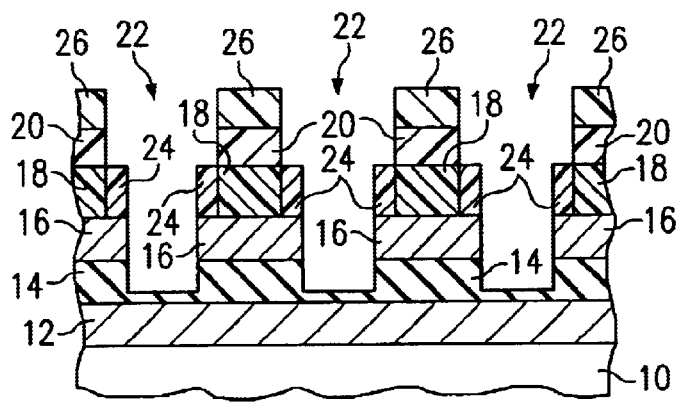

The semiconductor wafer is exposed to a single reactive ion etch (RIE) process, as shown in FIG. 5. A RIE chemistry 22, preferably comprising $Cl_2$, $BCl_3$, $N_2$, argon, or a combination thereof may be used, for example, when aluminum and TiN are used as conductive materials for the first metallization layer 12 and second metallization layer 16. Alternatively, an RIE gas 22 such as $SF_6$ may be used when W is used for the conductive material of the first and second metallization layers 12 and 16. Alternatively, other RIE gases 22 may be used for the single RIE etch of the present invention, such as HF and others, for example.

As the wafer is exposed to the RIE gas 22, a top portion of the second resist 20 is eroded away, shown generally at 26. Edge portions 24 of the first resist 18 not disposed beneath the second resist 20 are also eroded by the RIE gas 22. The RIE gas 22 simultaneously transfers the pattern from first resist 18 to second metallization layer 16 and dielectric layer 14, as shown in FIG. 5.

Figure 6:
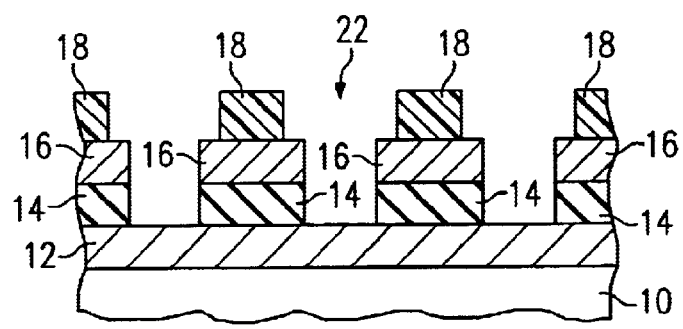

Continued exposure of the wafer to RIE gas 22 results in continued erosion of the top portion 26 of second resist 20 and edge portions 24 of first resist 18, in addition to further transferring of the patterns of the first and second resists 18 and 20 to underlying first and second metallization layers 12/16 and insulating layer 14, as shown in FIG. 6. At this stage of exposure to the RIE gas 22, the pattern from second resist 20 is essentially transferred to first resist 18, as shown. As the RIE gas 22 etches the wafer, the resulting structure is shown in FIG. 7, with the initial pattern of the second resist 20 being transferred to the second metallization layer 16 to form top plates 16, and the initial pattern of the first resist 18 being evident and transferred to the first metallization layer 12 and the dielectric layer 14.

Figure 7:
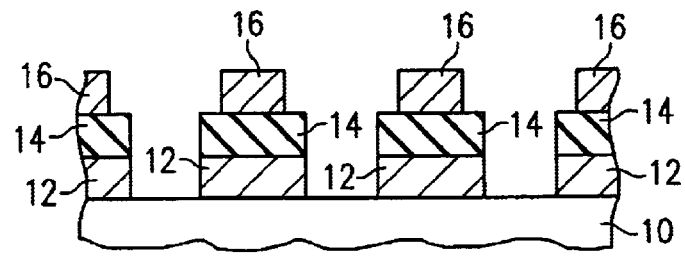

After the MIM capacitors are formed, the wafer is then exposed to a chemical such as oxygen plasma until the first resist is completely stripped, followed by a wet clean to remove any residuals, as shown in FIG. 7.

The present invention disclosed herein achieves technical advantages as a method of patterning top and bottom plates of a MIM capacitor that requires a single RIE step, which reduces the manufacturing complexity and results in the cost reduction for a semiconductor wafer. Critical dimensions (CD) of the patterning of the MIM capacitors are relaxed because the size of these capacitors are relatively large, a few micrometers for example. Hence, the pattern transfer is not required to be precise as in the prior art. The invention results in fewer defects and increased throughput. With the use of the single RIE pattern transfer in accordance with the present invention, one RIE step, one resist strip, and one cleaning step may be eliminated. The invention also results in a yield improvement.

The invention has been described herein with first resist 18 comprising a negative resist and second resist 20 comprising a positive resist. Alternatively, first resist 18 may comprise a positive resist, and second resist 20 may comprise a negative resist.

While the present invention has been described in detail herein with reference to a MIM capacitor, the present invention may also be used in semiconductor manufacturing applications where two or more metallization layers are required to be patterned on a single semiconductor device. In particular, an application where a lower metallization layer will be patterned with a larger pattern than an overlying smaller metallization pattern, the present invention is particularly advantageous. More broadly, the invention can be used in any semiconductor devices where there are two patterns on top of each other that require two successive lithography and RIE processes.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of patterning metal layers of a semiconductor wafer, the method comprising:

depositing a first conductive layer over a substrate;

depositing an insulating layer over the first conductive layer;

depositing a second conductive layer over the insulating layer;

depositing a first layer of resist over the second conductive layer;

patterning the first layer of resist with a first pattern;

developing said patterned first layer of resist;

removing portions of said first layer of resist according to said first pattern to expose portions of said second conductive layer;

depositing a second layer of resist over remaining portions of the first layer of resist and exposed portions of said second conductive layer;

patterning the second layer of resist with a second pattern;

developing said patterned second layer of resist;

stripping portions of said second layer of resist according to said second pattern; and etching the first conductive layer according to the first pattern and the second conductive layer according to the second pattern in a single etching process.

2. The method according to claim 1 wherein the single etching process comprises exposing the wafer to a single reactive ion etch process.

3. The method according to claim 1 wherein the first resist comprises a negative resist and the second resist comprises a positive resist.

4. The method according to claim 1 wherein the first resist comprises a positive resist and the second resist comprises a negative resist.

5. The method according to claim 1 wherein the insulating layer comprises a capacitor dielectric, wherein etching the first conductive layer comprises forming bottom metal plates of a MIM capacitor, and wherein etching the second conductive layer comprises forming top metal plates of the MIM capacitor.

6. The method according to claim 1 further comprising etching the insulating layer according to the first pattern.

7. A method of patterning metal layers of a semiconductor wafer, the wafer comprising a first conductive layer, an insulating layer disposed over the first conductive layer and a second conductive layer disposed over the insulating layer, the method comprising:

depositing a first layer of resist over the second conductive layer;

patterning the first layer of resist with a first pattern;

developing said patterned first layer of resist;

removing portions of said first layer of resist according to said first pattern to expose portions of said second conductive layer;

depositing a second layer of resist over remaining portions of the first layer of resist and exposed portions of said second conductive layer;

patterning the second layer of resist with a second pattern;

developing said patterned second layer of resist;

stripping portions of said second layer of resist according to said second pattern; and etching the first conductive layer according to the first pattern and the second conductive layer according to the second pattern in a single etching process.

8. The method according to claim 7 wherein the single etching process comprises exposing the wafer to a reactive ion etch process.

9. The method according to claim 8 wherein the first resist comprises a negative resist and the second resist comprises a positive resist.

10. The method according to claim 8 wherein the first resist comprises a positive resist and the second resist comprises a negative resist.

11. The method according to claim 8 wherein the insulating layer comprises a capacitor dielectric, wherein etching the first conductive layer comprises forming bottom metal plates of a MIM capacitor, and wherein etching the second conductive layer comprises forming top metal plates of the MIM capacitor.

12. The method according to claim 7 further comprising etching the insulating layer according to the first pattern.

13. A method of forming capacitive plates of a MIM capacitor, comprising:

providing a wafer having a substrate;

depositing a first conductive layer on the substrate;

depositing a capacitor dielectric layer over the first conductive layer;

depositing a second conductive layer over the capacitor dielectric layer;

depositing a first layer of resist over the second conductive layer;

patterning the first layer of resist with a first pattern;

developing said patterned first layer of resist;

removing portions of said first layer of resist according to said first pattern to expose portions of said second conductive layer;

depositing a second layer of resist over remaining portions of the first layer of resist and exposed portions of said second conductive layer;

patterning the second resist with a second pattern;

developing said patterned second layer of resist;

stripping portions of said second layer of resist according to said second pattern; and etching the first conductive layer according to the first pattern and the second conductive layer according to the second pattern in a single etching process.

14. The method according to claim 13 wherein the single etching process comprises exposing the wafer to a reactive ion etch process.

15. The method according to claim 13 wherein the first resist comprises a negative resist and the second resist comprises a positive resist.

16. The method according to claim 13 wherein the first resist comprises a positive resist and the second resist comprises a negative resist.

17. The method according to claim 13 further comprising etching the insulating layer according to the first portion.

18. The method according to claim 1 wherein said step of patterning the first layer of resist comprises the step of patterning with a lithographic process.

19. The method according to claim 18 wherein said step of patterning the second layer of resist comprises the step of patterning with a lithographic process.

* * * * *